United States Patent
Nguyen et al.

(10) Patent No.: US 9,197,283 B1
(45) Date of Patent: Nov. 24, 2015

(54) RECONFIGURABLE WIDEBAND CHANNELIZED RECEIVER

(71) Applicant: RAYTHEON COMPANY, Waltham, MA (US)

(72) Inventors: Tuan V. Nguyen, Anaheim, CA (US); Oleg Brovko, Los Angeles, CA (US); Alison Kim, Palos Verdes Estates, CA (US); Jing Z. Stafsudd, Torrance, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/576,039

(22) Filed: Dec. 18, 2014

(51) Int. Cl.
 *H04B 1/00* (2006.01)
 *H04B 1/707* (2011.01)
 *H04B 1/16* (2006.01)

(52) U.S. Cl.
 CPC .............. *H04B 1/70712* (2013.01); *H04B 1/16* (2013.01)

(58) Field of Classification Search
 CPC ............................. H04B 1/70712; H04B 1/16
 USPC ....................................................... 375/147
 See application file for complete search history.

(56) References Cited

U.S. PATENT DOCUMENTS

| | | | |
|---|---|---|---|
| 6,005,900 A | 12/1999 | Zangi | |
| 7,489,745 B2 | 2/2009 | Fudge | |
| 2005/0281318 A1* | 12/2005 | Neugebauer | 375/134 |
| 2008/0266014 A1* | 10/2008 | Ma et al. | 332/103 |
| 2011/0294453 A1* | 12/2011 | Mishali et al. | 455/293 |
| 2013/0093607 A1* | 4/2013 | Yasuda et al. | 341/100 |
| 2014/0169501 A1* | 6/2014 | Nazarathy et al. | 375/316 |
| 2014/0232581 A1* | 8/2014 | Nguyen et al. | 341/155 |

\* cited by examiner

*Primary Examiner* — Tanmay Shah

(74) *Attorney, Agent, or Firm* — Christie, Parker & Hale, LLP

(57) ABSTRACT

A method and apparatus for sampling a high bandwidth analog signal includes: splitting the high bandwidth analog signal into N parallel channels; randomly demodulating each of the signals; sampling each demodulated signal using a sub-Nyquist sampling rate; combining each sampled signal into a sub-Nyquist signal; compressive sensing the combined sub-Nyquist signal to estimate missing samples of a full Nyquist rate uniform sample set X(n); convolving X(n) with N analysis filters, each analysis filter having a different coefficient; decimating output of each analysis filter using decimation ratios of M:1 to generate a sub-banded signal set $Y_i$ (n), i=1, ..., N; processing the sub-banded signal set; up-sampling each processed sub-band signal by M; convolving each up-sampled sub-band signal with a corresponding synthesis filter; and combining two or more of the convolved signals to generate a non-uniform spectral partitioning of the high bandwidth analog signal.

15 Claims, 6 Drawing Sheets

RECONFIGURABLE WIDEBAND CHANNELIZED RECEIVER

FIELD OF THE INVENTION

The present invention generally relates to signal processing and electronic circuits and more particularly to a reconfigurable wideband channelized receiver.

BACKGROUND

Digital signal sampling is utilized in many different applications, such as signal (data, speech, video, etc.) processing, high-speed data converters, data communication devices, such as receivers and transmitters and the like.

A sampling rate refers to the frequency of analog to digital conversion employed to capture information contained in an analog signal. To allow a complete reconstruction of a signal with discrete sampled data, the sampling rate must comply with the Nyquist theorem, which assumes sampling at uniform time steps. Nyquist frequency is defined as the minimum required sampling frequency for a given signal bandwidth which permits reconstruction of the signal without loss of information. If one assumes that an appropriate band-limiting filter precedes the analog-to-digital converter, then aliasing is minimized. In practice, the sampling frequency employed in actual implementations is characteristically greater than the (sometimes twice, depending on the definition) Nyquist frequency to reduce distortion of the digital instantiation of the signal.

The Problem of detecting an unknown signal somewhere in a large spectral region is typically dealt with via one of the following approaches: (A) Full (Nyquist) rate sampling of the large spectral region with a high sample rate analog-to-digital converter to recover the signal; B) Analog (pre-filter) sub-banding followed by (Nyquist) sampling of analog sub-bands and sub-band channel equalization; or C) Random demodulation combined with compressive sensing.

Method A is a frequently employed technique which utilizes very high speed analog-to-digital convertor (ADC) technology. However, high speed analog-to-digital conversion may be limited by dynamic range restrictions. Method B is commonly invoked to overcome analog-to-digital converter dynamic range limitations. This approach employs a massively parallel implementation wherein the wide frequency region of interest is partitioned into sub-bands by parallel analog band-pass filters. Method B requires equalization among adjacent analog sub-band partitions. Method C is a classical single channel random demodulator (discussed in literature) followed by compressive sensing to unwrap the aliased narrow-band spectrum resulting from under sampling. This approach works well for detection of sparse (narrow-band) signals across the wide band of interest. Method C is not suitable for recovery of wideband signals.

FIG. 1 shows a (Method A) conventional channelized receiver. In this approach, a wide band input analog signal X(t), with a frequency of 4 GHz (example), is input to an anti-aliasing filter 102 to reject signals outside of the band of interest. The anti-aliasing BPF (102) filter attenuates signals outside of the spectrum of interest. A full Nyquist rate analog-to-digital converter (ADC) 104 with a sampling frequency Fs, equal to or greater than the Nyquist frequency of the input signal, samples the output of the anti-aliasing filter, converting the analog signal to a digital signal. The output of the ADC 104 is then channelized by a (fixed resolution) filter bank 106. The full Nyquist rate ADC (104) samples the entire signal spectrum of interest. Sampled data are separated via a uniform fixed filter bandwidth (106). The channelizer (filter bank) 106 decomposes the wideband signal into equally spaced partitions. Estimated X(t) suffers from ADC dynamic range (maximum to minimum signal) limitation; and distortion (ripple & group delay) of signals wider than the channelizer fixed filter bandwidth.

Method B is frequently employed to bypass ADC sample rate and spur free dynamic range constraints by employing lower speed, higher dynamic range ADCs. In this approach, reconstruction of the original signal set with minimum distortion requires adaptive equalization to minimize phase & magnitude distortion among adjacent filter cross over regions, and filter pass band ripple distortion. An artifact that is difficult to overcome in this method is rejection of adjacent pass-band filter stop band leakage resulting from finite (analog) filter stop band rejection.

SUMMARY

In some embodiments the present invention is a method for sampling a high bandwidth analog signal. The method includes: receiving the high bandwidth analog signal; splitting the received the high bandwidth analog signal into N parallel channels, where N is an integer; randomly demodulating each of the signals in each N parallel channels; sampling each randomly demodulated signal using a sub-Nyquist sampling rate; combining each sampled signal into a sub-Nyquist digitized random demodulated signal; compressive sensing the combined sub-Nyquist digitized random demodulated signal to estimate missing samples of a full Nyquist rate uniform sample set X(n); convolving X(n) with N analysis filters, each analysis filter having a different coefficient; decimating output of each analysis filter using decimation ratios of M:1 to generate a sub-banded signal set $Y_i(n)$, i=1, . . . , N, where M is an integer less than or equal to N; processing the sub-banded signal set; up-sampling each processed sub-band signal by M; convolving each up-sampled sub-band signal with a corresponding synthesis filter; and combining two or more of the convolved signals to generate a non-uniform spectral partitioning of the high bandwidth analog signal.

In some embodiments the present invention is an apparatus, for example, a reconfigurable wideband channelized receiver, for sampling a high bandwidth analog signal. The apparatus includes: a plurality of splitter for splitting the high bandwidth analog signal into N parallel channels, where N is an integer; a plurality of demodulators for randomly demodulating each of the signals in each N parallel channels; a plurality of samplers for sampling each randomly demodulated signal using a sub-Nyquist sampling rate; a first combiner for combining each sampled signal into a sub-Nyquist digitized random demodulated signal; a compressive sensor for compressive sensing the combined sub-Nyquist digitized random demodulated signal to estimate missing samples of a full Nyquist rate uniform sample set X(n); a plurality of analysis filters for convolving X(n), each analysis filter having a different coefficient; a plurality of decimators for decimating output of each analysis filter using decimation ratios of M:1 to generate a sub-banded signal set $Y_i(n)$, i=1, . . . , N, where M is an integer less than or equal to N; a processor for processing the sub-banded signal set; a plurality of up-samplers for up-sampling each processed sub-band signal by M; a plurality of synthesis filters for convolving each up-sampled sub-band signal with a corresponding synthesis filter; and a second combiner for combining two or more of the convolved signals to generate a non-uniform spectral partitioning of the high bandwidth analog signal.

In some embodiments the present invention is a method for sampling a high bandwidth analog signal. The method includes: receiving the high bandwidth analog signal; splitting the received the high bandwidth analog signal into N parallel channels, where N is an integer; randomly demodulating each of the signals in each N parallel channels; sampling each randomly demodulated signal using a sub-Nyquist sampling rate; combining each sampled signal into a sub-Nyquist digitized random demodulated signal; compressive sensing the combined sub-Nyquist digitized random demodulated signal to estimate missing samples of a full Nyquist rate uniform sample set X(n); sequentially delaying X(n) with N identical first delays to generate N delayed signals; decimating each of the N delayed signals by M, where M is an integer less than or equal to N; filtering each of the N decimated signals by N corresponding identical filters; performing a Fast Fourier Transform (FFT) on the N filtered signals; processing outputs of the FFT; performing an inverse Fast Fourier Transform (IFFT) on the processed signals; filtering outputs of the IFFT to generate N filtered signals; up-sampling each filtered signal; sequentially delaying each up-sampled signal with N identical second delays; and combining two or more of the delayed up-sampled signals to generate a non-uniform spectral partitioning of the high bandwidth analog signal.

In some embodiments the present invention is an apparatus, for example, a reconfigurable wideband channelized receiver, for sampling a high bandwidth analog signal. The apparatus includes: a plurality of splitter for splitting the high bandwidth analog signal into N parallel channels, where N is an integer; a plurality of demodulators for randomly demodulating each of the signals in each N parallel channels; a plurality of samplers for sampling each randomly demodulated signal using a sub-Nyquist sampling rate; a first combiner for combining each sampled signal into a sub-Nyquist digitized random demodulated signal; a compressive sensor for compressive sensing the combined sub-Nyquist digitized random demodulated signal to estimate missing samples of a full Nyquist rate uniform sample set X(n); a first tapped delay line including N identical first delays for sequentially delaying X(n) to generate N delayed signals; a plurality of decimators for decimating each of the N delayed signals by M, where M is an integer less than or equal to N; a first plurality of filters for filtering each of the N decimated signals; a Fast Fourier Transform (FFT) module for performing an FFT (shift) on the N filtered signals; a processor for processing outputs of the FFT; an Inverse Fast Fourier Transform (IFFT) module for performing an IFFT on the processed signals; a second plurality of filters for filtering outputs of the IFFT to generate N filtered signals; a plurality of up-samplers for up-sampling each filtered signal; a second tab delay line including N identical second delays for sequentially delaying each up-sampled signal; and a second combiner for combining two or more of the delayed up-sampled signals to generate a non-uniform spectral partitioning of the high bandwidth analog signal.

BRIEF DESCRIPTION OF THE DRAWINGS

A more complete appreciation of the present invention, and many of the attendant features and aspects thereof, will become more readily apparent as the invention becomes better understood by reference to the following detailed description when considered in conjunction with the accompanying drawings in which like reference symbols indicate like components, wherein.

DETAILED DESCRIPTION

Figure 1:
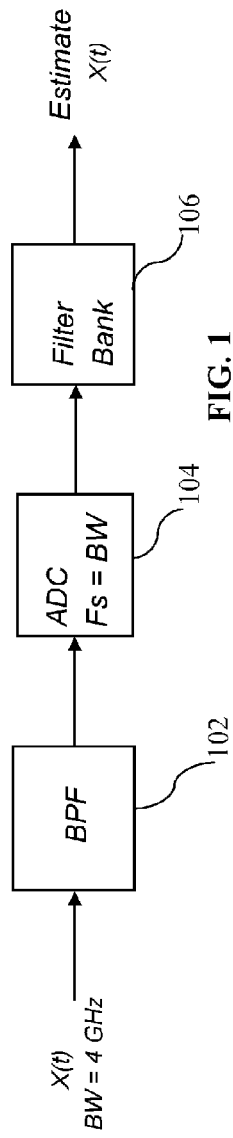
FIG. 1 illustrates an exemplary conventional wideband channelized receiver using single high speed (full Nyquist rate) ADC.

The present invention will now be described more fully with reference to the accompanying drawings, in which exemplary embodiments thereof are shown. The invention may, however, be embodied in many different forms and should not be construed as being limited to the embodiments set forth herein. Rather, these embodiments are provided so that this disclosure is thorough and complete, and will fully convey the concept of the present invention to those skilled in the art. In some embodiments, the method of the present invention is performed by an electronic circuit to transform a high bandwidth analog signal to a digital signal representing the analog signal. In some embodiments, the method of the present invention is performed by an electronic circuit and a processor, such as a digital signal processor.

In some embodiments, the present invention is a reconfigurable wideband channelized receiver, which alleviates the problem of estimating/sampling an arbitrary collection of wide and narrow band signals within a given spectral region and without a priori knowledge of the signals themselves. In conventional receivers, it is necessary to know the center frequency and bandwidth of a signal before band pass filtering and sampling, and reconstruction can be executed with minimum distortion. In uniform channelizers, where appropriate distortion constraints for analysis and synthesis filters have not been invoked during filter design, signal reconstruction with minimum distortion cannot be achieved. The reconfigurable channelized receiver of the present invention does not require a priori knowledge of the signal location within a spectral region neither does it require a priori knowledge of the signal bandwidth, prior to recovery.

The reconfigurable channelized receiver employs random demodulation, high dynamic range sub-Nyquist ADC sampling, compressive sensing and minimum distortion filtering to implement a high dynamic range receiver that is able to simultaneously recover (wide and narrow band) signals within the same receiver without a priori knowledge of specific location or bandwidth. Unlike classical random modulation which uses a single spreading (channel) code to demodulate narrow band signals, this receiver employs parallel synchronous random demodulators, each of which is modulated with non-identical pseudo-random binary spreading codes to uniquely demodulate signals. Synchronized high dynamic range sub-Nyquist ADCs are employed to digitize the output of each random demodulator.

The approach discussed above is one example that is employed to enforce uniqueness among the N parallel random demodulator channels by employing different pseudo-noise sequences. Signal "uniqueness" can also be achieved by employing a different strategy wherein the same pseudo noise code is used at each demodulator and the same sample rate is used for each ADC, with the proviso that the sum of the N sample rates is equal to or greater than the Nyquist rate of the analog input signal.

The adaptation of multiple random demodulators with unique codes and compressive sensing allows the reconfigurable channelized receiver to perform in a regime where the observation matrix rank (sample rate) employed to recover signals of interest is less than the full rank (Nyquist rate) of the spectrum under observation, which is a restriction associated with conventional signal capturing techniques. The key to employing sub-Nyquist sampling (less than full rank) in the receiver is that aliasing created during sub-Nyquist sampling is unambiguously unwrapped during compressive sensing due to use of non-identical spreading codes in each pseudo-random demodulator.

In some embodiments, the present invention provides non-uniform channelizer sub-band resolution, which effectively provides a spectral zoom capability that is not accessible through use of a classical fixed resolution channelizer. Synthesis filter outputs can subsequently be combined in arbitrary linear combination (with requisite distortion and group delay) to produce spectral resolutions ranging from the smallest filter pass band to the maximal analog input bandwidth contained within the original spectrum. The net result is a receiver that provides high dynamic sampling of multiple signals contained within extremely wide spectral regions without a priori knowledge of the signal construct or distribution.

Figure 2:
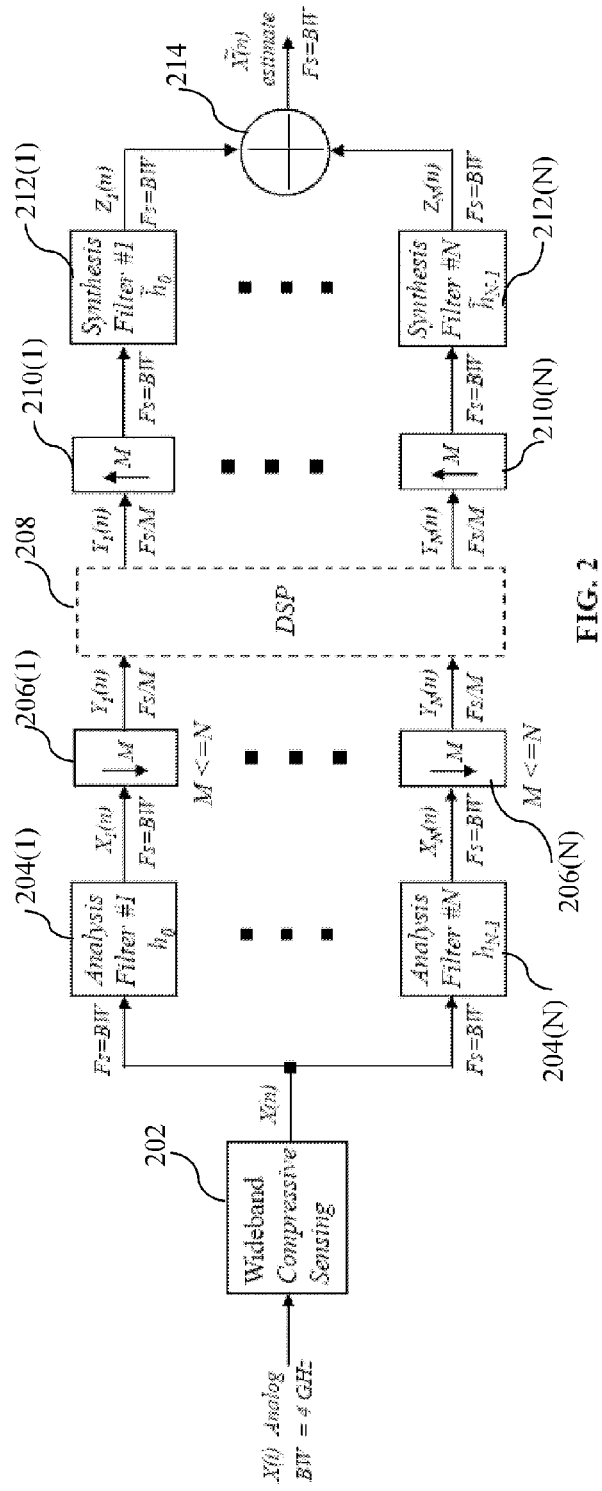
FIG. 2 illustrates an exemplary reconfigurable wideband channelized receiver, according to some embodiments of the present invention.

FIG. 2 illustrates a block diagram for an exemplary reconfigurable wideband channelized receiver, according to some embodiments of the present invention. As shown, an analog wide band signal of X(t) with a bandwidth of BW (for example, 4 GHz) is received by a wideband compressive sensor device 202. Here, in contrast to the conventional system, the compressive sensor device 202 includes slower ADCs with high dynamic range (for example, greater than 10 effective number of bits-ENOB). The output of the compressive sensor device 202, X(n) is a discrete signal, which is restored to Nyquist sampling (4 GHz, in this example) by compressive sensing.

The discrete signals X(n) is then input to an array of N analysis filters (204(1) to 204(N)). The analysis filters 204 partitions the full rate signal X(n) into N time domain signals. In other words, the analysis filters 204 break the discrete signal X(n) into N sub-bands channels. In some embodiments, the analysis filters 204 are bandpass filters, each with a different center frequency and different coefficient. Each of the outputs of the analysis filters 204 ($X_1(n)$ to $X_N(n)$) has a sampled frequency equal to BW. The output of each analysis filter Xi(n), i=1, 2, . . . , N−1, N, is the time domain representation of the sub-band filter response, each centered around the appropriate sub-band center frequency, and convolved with the Nyquist rate data stream X(n). Each of the (full Nyquist rate, Fs sub-band channels) $X_1(n)$ to $X_N(n)$ are then decimated by corresponding decimators 206(1) to 206(N), using a decimation factor of M, which is less than or equal to N. As a result, N corresponding decimated signals, $Y_1(n)$ to $Y_N(n)$, each having a sample rate of Fs/M, are generated.

The decimated signals, $Y_1(n)$ to $Y_N(n)$, may now be conveniently and efficiently processed, for example, by a digital signal processor (DSP) 208. For instance, the DSP 208 may be performing pulse compression, Doppler processing, spectral sharing or any other types of signal processing. Processing at the DSP may be employed to steer decisions that determine sub-band combination at the output.

The outputs of the DSP 208, $Y_1(n)$ to $Y_N(n)$, are then up-sampled 210(1) to 210(N), by insertion of M-1 "0s" between successive samples of Yi(n), I=1, 2, . . . , N, in each sub-band channel, restoring each sub-band to Nyquist sampling rate, Fs. Each of the up-sampled signals is then input to a corresponding synthesis filter (212(1) to 212(N)) to reject spectral images of the sub-band data created during up-sampling 210(1), . . . , 210(N) and generate outputs $Z_1(n)$ to $Z_N(n)$. The outputs $Z_1(n)$ to $Z_N(n)$ are time domain representations of sub-band partitioned X(n), some or all of which may be summed, for example, by a summer 214 in any order desired. If the intent is to re-generate an estimate signal of X (n), all sub-band channels are then summed together.

Figure 3:
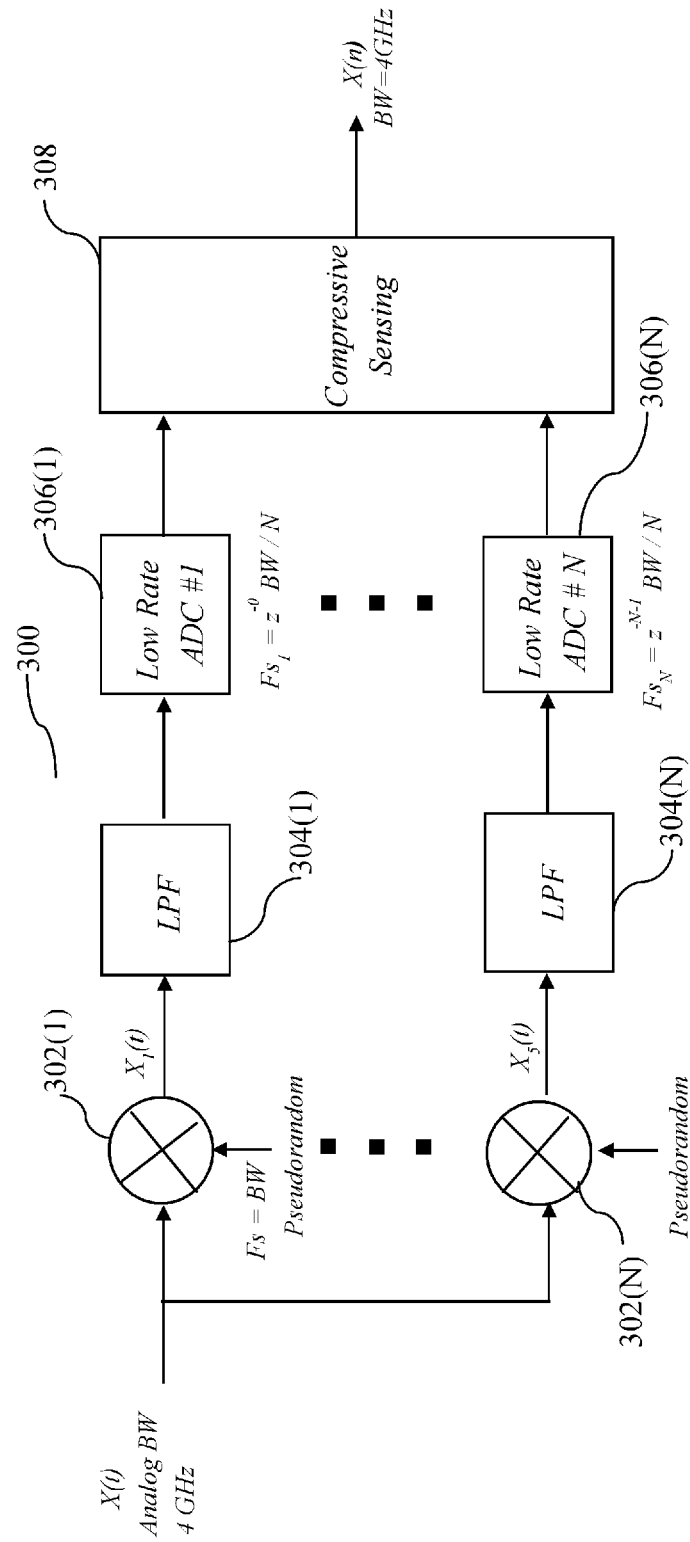
FIG. 3 shows an exemplary parallel wide band random demodulator followed by compressive sensing circuit, according to some embodiments of the present invention.

FIG. 3 shows an exemplary wideband compressive sensing circuit 300, which includes random demodulators, according to some embodiments of the present invention. The wideband random demodulator and compressive sensing (CS) circuit converts a wideband analog input signal to a digital signal at high dynamic rate. As shown, the wideband analog input signal X(t) is de-modulated by N random demodulators 302(1) to 302(N) using N different/unique pseudo-random binary code sequences $P_c(t)$ of {+/−1}. The outputs of each of the N demodulators 302(1) to 302(N) is passed through N anti-aliasing (low pass) filter 304(1) to 304(N).

The PN code modulation spreads signals contained within X(t) across the bandwidth of the spreading code so that it is not filtered out by the low pass filters (integrators) 304s. The sum of the N–ADC sampling rates must be equivalent to the total Nyquist rate, Fs, of X(t).

Figure 4:
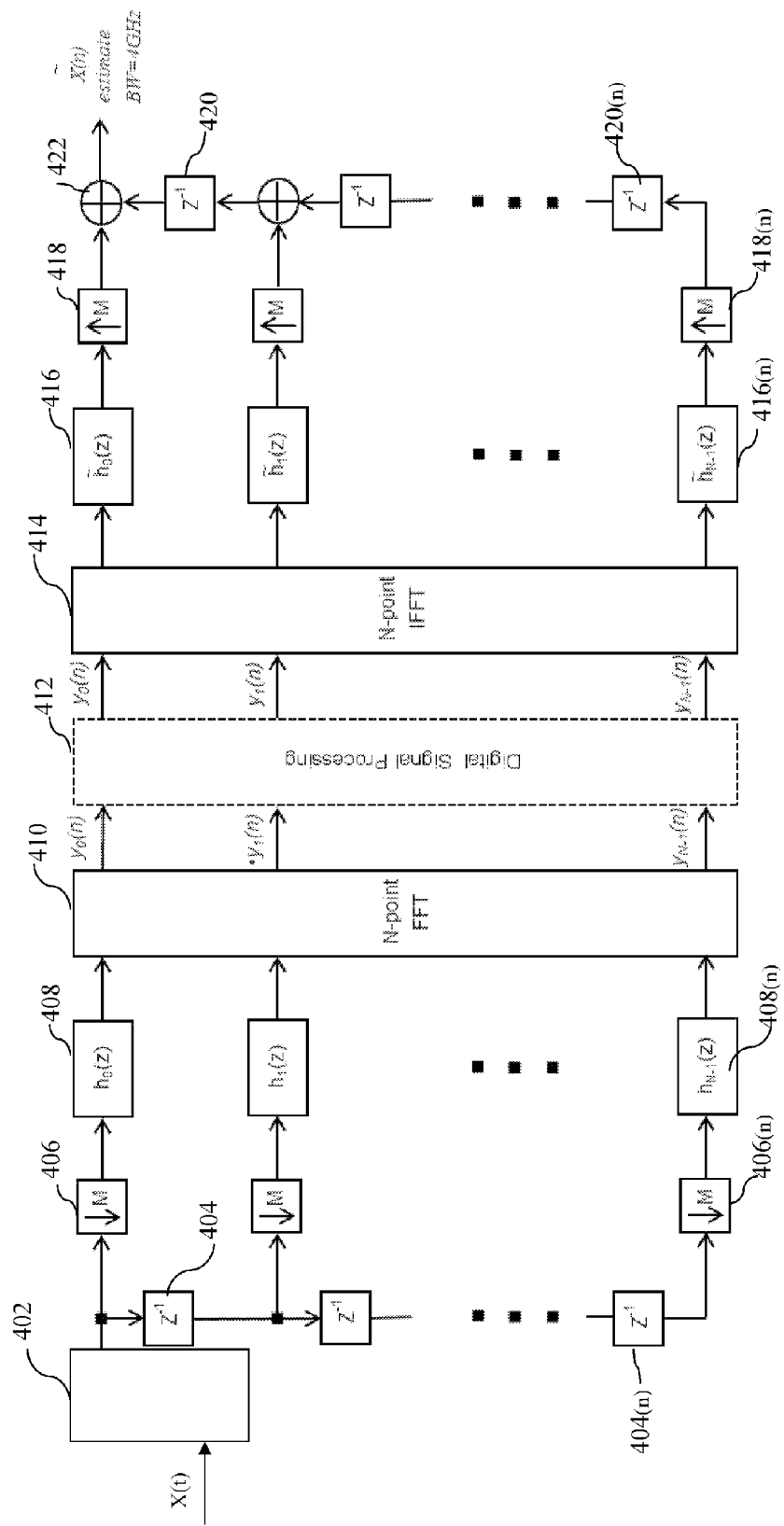
FIG. 4 shows an exemplary block diagram for an exemplary reconfigurable wideband channelized receiver, according to some embodiments of the present invention.

FIG. 4 shows an exemplary block for a typical hardware implementation of a channelizer. The implementation is not essential to this invention. As depicted, an analog wide band signal of X(t) with a bandwidth of BW (for example, 4 GHz) is received by a wideband compressive sensor device 402. The compressive sensor device 402 is similar to the compressive sensor device 202 of FIG. 2 and includes slower ADCs with high dynamic range. The output of the compressive sensor device 402, X(n) is a discrete signal, which is restored to Nyquist sampling by compressive sensing. The discrete signal X(n) is then input to a tab delay line 404 comprising of N delay elements 404(0) to 404(N−1) with equal delay to generate a series of sequentially equally delayed signals. Each of the delayed signals are then decimated by corresponding decimators 406(0) to 406(N−1), using a decimation factor of M, which is less than or equal to N. As a result, N corresponding decimated signals, each having a sample rate of Fs/M, are generated. Each of the decimated signals is then convolved with corresponding N analysis filters 408(0) to 408(N−1) to generate spectrally ambiguous filtered versions of the decimated wideband signal X(t). The outputs of the N analysis filters are then input to a (N-point) Fast Fourier Transform (FFT) module 410, which shifts each ambiguous sub-band spectrum to the correct un-ambiguous spectral frequency to generate $y_0(n)$ to $y_{N-1}(n)$ signals. The frequency shifted sub-band signals $y_0(n)$ to $y_{N-1}(n)$, may now be conveniently and efficiently processed, for example, by a digital signal processor (DSP) 412.

The outputs of the DSP 412, $y_0(n)$ to $y_{N-1}(n)$, are then input to a (N-point) Inverse Fast Fourier Transform (IFFT) module 414 to transform $y_0(n)$ to $y_{N-1}(n)$, back into original versions of each sub-banded portion of the original wideband signal X(t). The outputs of the IFFT module 414 are then convolved with corresponding synthesis filters 416(1) to 416(N) to remove ambiguous images generated by the IFFT. The outputs of the filters 416(1) to 416(N) are then up-sampled by corresponding up-samplers 418(1) to 418(N), by inserting M-1 "0's" between successive samples of Yi(n), I=1, 2, . . . , N, in each sub-band channel, restoring each sub-band to full Nyquist sampling, Fs. Each of the up-sampled signals is then input to a taped delay line 420 comprising of N delay elements 420(1) to 420(N), similar to N delay elements 404(1) to 404(N) and with equal delays to reverse the time shift delays introduced by IFFT processing. Two or more outputs of the delay elements (tapped delay line) 420(1) to 420(N), are then summed, for example, by a summer 422 in the same order that they were originally delayed by the N delay elements 404(0) to 404(N−1) to re-generate an estimate signal of X (n). For example, there may be an On-Off switch at the output of each up-sampler 418 (not shown) that selectively feeds or stops respective up-sampled signals to the corresponding delay elements 420(1) to 420(N).

In this case, signal uniqueness may be incorporated into the observation vector by delaying each ADC output relative to its neighbors by linearly increasing (sample) delays. Other delay strategies accomplish the same result during compressive sensing, however the processing may become more complicated.

Figure 5:
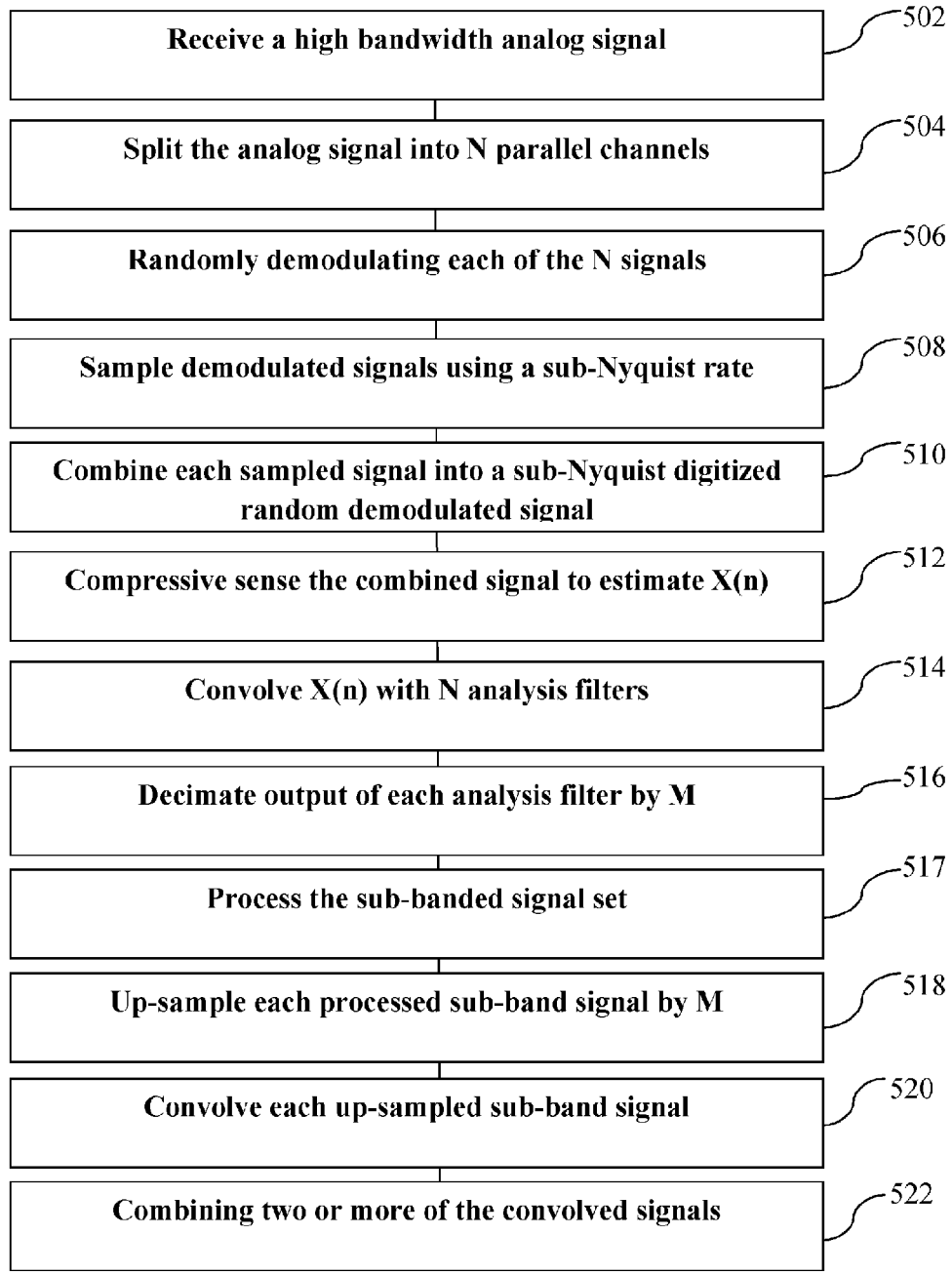
FIG. 5 shows an exemplary process flow for a reconfigurable wideband channelized receiver, according to some embodiments of the present invention.

FIG. 5 shows an exemplary process flow for a reconfigurable wideband channelized receiver, according to some embodiments of the present invention. As illustrated, a high bandwidth analog signal is received, in block 502. The received high bandwidth analog signal is split into N parallel channels, in block 504. In block 506, each of the signals in each N parallel channels is randomly demodulated, and each randomly demodulated signal is then sampled using a sub-Nyquist sampling rate, in block 508. In block 510, each sampled signal is combined into a sub-Nyquist digitized random demodulated signal, and the combined sub-Nyquist digitized random demodulated signal is compressive sensed to estimate missing samples of a full Nyquist rate uniform sample set X(n), in block 512.

In block 514, the X(n) signal is convolved with N analysis filters, each having a different coefficient. In block 516, the output of each analysis filter is decimated using decimation ratios of M:1 to generate a sub-banded signal set $Y_i$ (n), i=1, . . . , N, where M is an integer less than or equal to N. The sub-banded signal set may be processed by a DSP, in block 518. In block 520, each processed sub-band signal is up-sampled by M, and each up-sampled sub-band signal is convolved with a corresponding synthesis filter, in block 522. In block 524, two or more of the convolved signals are combined to generate a non-uniform spectral partitioning of the high bandwidth analog signal. If an estimate signal of X (n) is desired, then all sub-band channels are summed together.

Figure 6:
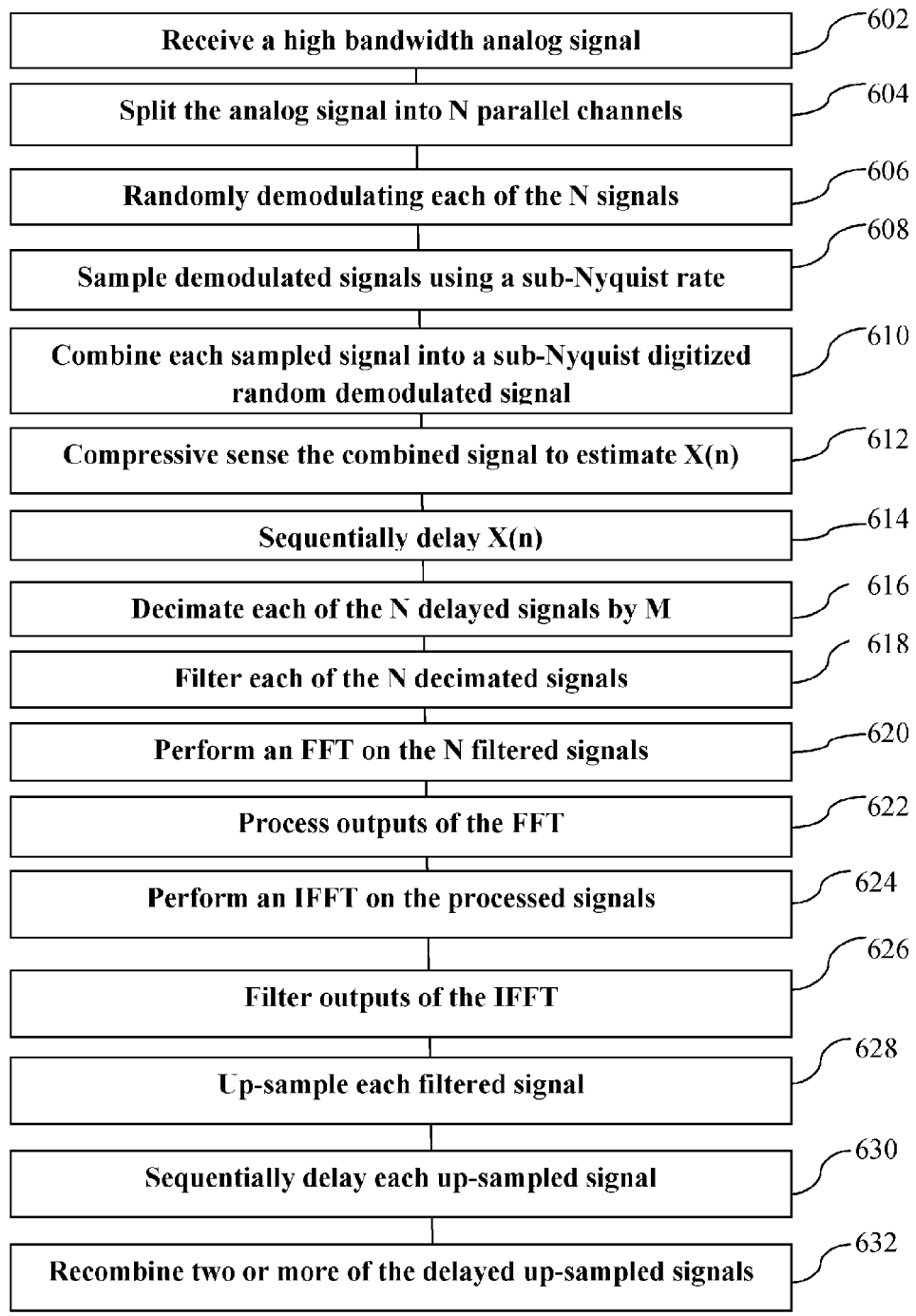
FIG. 6 depicts an exemplary process flow for a reconfigurable wideband channelized receiver, according to some embodiments of the present invention.

FIG. 6 depicts an exemplary process flow for a reconfigurable wideband channelized receiver, according to some embodiments of the present invention. As shown, a high bandwidth analog signal is received, in block 602. The received high bandwidth analog signal is split into N parallel channels, in block 604. In block 606, each of the signals in each N parallel channels is randomly demodulated, and each randomly demodulated signal is then sampled using a sub-Nyquist sampling rate, in block 608. In block 610, each sampled signal is combined into a sub-Nyquist digitized random demodulated signal, and the combined sub-Nyquist digitized random demodulated signal is compressive sensed to estimate missing samples of a full Nyquist rate uniform sample set X(n), in block 612.

In block 614, X(n) is sequentially delayed with N identical first delays to generate N delayed signals. Each of the N delayed signals is then decimated by M, in block 616. In block 618, each of the N decimated signals is filtered by N corresponding filters, and a Fast Fourier Transform (FFT) is performed on the N filtered signals, in block 620. The outputs of the FFT may be processed, for example, by a DSP in block 622, and an IFFT is performed on the processed signals, in block 624.

In block 626, the outputs of the IFFT are filtered to generate N filtered signals, and each filtered signal is up-sampled, in block 628. Two or more of the up-sampled signal is then sequentially delayed with N identical second delays, in block 630. In block 632, the two or more of the delayed up-sampled signals are combined to generate a non-uniform spectral partitioning of the high bandwidth analog signal. If an estimate signal of X (n) is desired, then all of the up-sampled signals are delayed and all of the delayed up-sampled signals are summed together.

Figure 7:
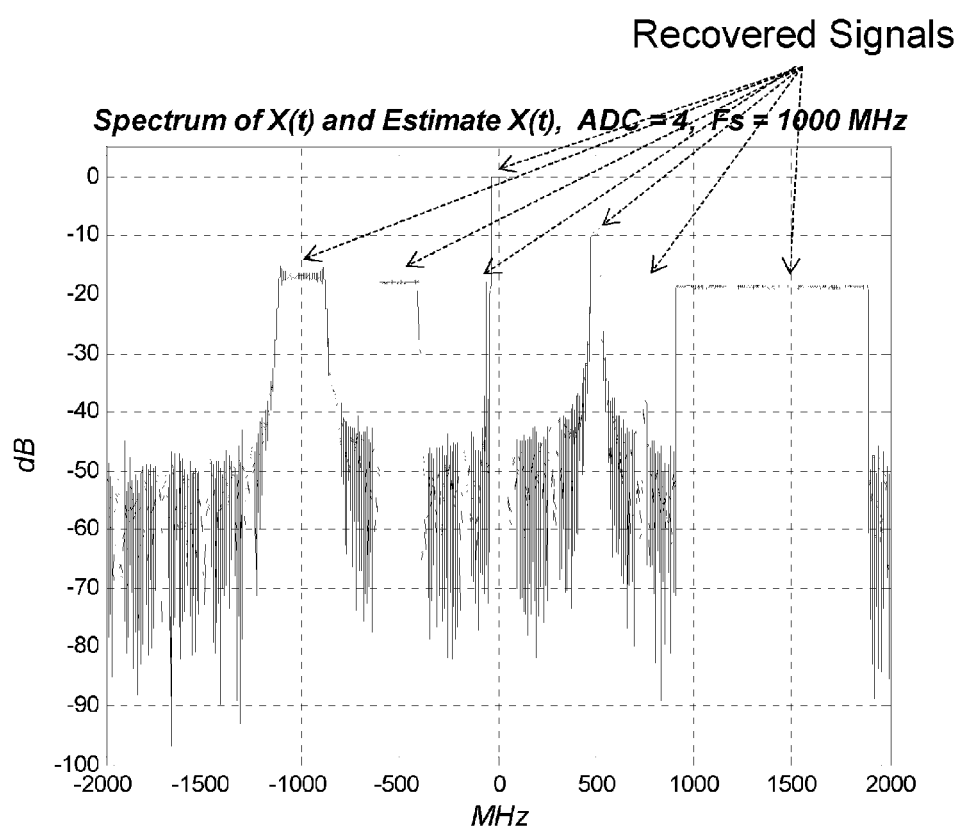
FIG. 7 shows an exemplary simulation result of a spectrum reconstruction of wide band analog signal containing wide band and narrow band signals using the reconfigurable channelized receiver of the present invention.

FIG. 7 provides a simulation result of a spectrum reconstruction of a wide band analog signal containing wide band and narrow band signals using the reconfigurable channelized receiver of the present invention. The simulation parameters include a mixture of wideband and narrow band (CW) signals, which are unknown to Random demodulation scheme. In this example, the bandwidth of X(t) is 4 GHz. The original X(t) is depicted by the darker curve and the estimate of X(t) using compressive sensing m is shown by the lighter curve. The CS method is using an FFT of 32,768 points to compute X(t) spectrum and the estimate X(t) spectrum. As illustrated, the significant information contained in the graph indicates virtually no difference (or very little difference) between the original and the estimate spectral plot.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:
1. A method for sampling a wideband analog signal, the method comprising:
 receiving the wideband analog signal;
 splitting the received wideband analog signal into N parallel channels, where N is an integer;
 randomly demodulating each of the signals in N parallel channels with non-identical pseudo-random binary spreading codes to uniquely demodulate each of the signals in each N parallel channels;
 sampling each randomly demodulated signal using a sub-Nyquist sampling rate;
 combining each sampled signal into a sub-Nyquist digitized random demodulated signal;
 compressive sensing the combined sub-Nyquist digitized random demodulated signal to estimate missing samples of a full Nyquist rate uniform sample set X(n);
 convolving the uniform sample set X(n) with N analysis filters, each analysis filter having a different coefficient, to break the X(n) signal into N sub-bands channels;

decimating output of each analysis filter using decimation ratios of M:1 to generate a sub-banded signal set $Y_i(n)$, i=1, . . . , N, where M is an integer less than or equal to N;

processing the sub-banded signal set;

up-sampling each processed sub-band signal by M;

convolving each up-sampled sub-band signal with a corresponding synthesis filter; and combining two or more of the convolved signals to generate a non-uniform spectral partitioning of the wideband analog signal.

2. The method of claim 1, wherein the combining two or more of the convolved signals further comprises summing all of the convolved signals to generate a reconstructed signal of the wideband analog signal.

3. The method of claim 1, wherein the generation of the non-uniform spectral partitioning of the wideband analog signal is performed without knowledge of the signal location within a spectral region and without knowledge of the bandwidth of the wideband analog signal.

4. The method of claim 1, wherein the up-sampling each processed sub-band signal by M further comprises inserting M-1 0s between successive samples, in each sub-band channel to restore each sub-band signal to a Nyquist sampling rate.

5. An apparatus for sampling a wideband analog signal comprising:

a plurality of splitters for splitting the wideband analog signal into N parallel channels, where N is an integer;

a plurality of demodulators for randomly demodulating each of the signals in N parallel channels with non-identical pseudo-random binary spreading codes to uniquely demodulate each of the signals in each N parallel channels;

a plurality of samplers for sampling each randomly demodulated signal using a sub-Nyquist sampling rate;

a first combiner for combining each sampled signal into a sub-Nyquist digitized random demodulated signal;

a compressive sensor for compressive sensing the combined sub-Nyquist digitized random demodulated signal to estimate missing samples of a full Nyquist rate uniform sample set $X(n)$;

a plurality of analysis filters for convolving the uniform sample set $X(n)$ to break the $X(n)$ signal into N sub-bands channels, each analysis filter having a different coefficient;

a plurality of decimators for decimating output of each analysis filter using decimation ratios of M:1 to generate a sub-banded signal set $Y_i(n)$, i=1, . . . , N, where M is an integer less than or equal to N;

a processor for processing the sub-banded signal set;

a plurality of up-samplers for up-sampling each processed sub-band signal by M;

a plurality of synthesis filters for convolving each up-sampled sub-band signal with a corresponding synthesis filter; and a second combiner for combining two or more of the convolved signals to generate a non-uniform spectral partitioning of the wideband analog signal.

6. The apparatus of claim 5, wherein the second combiner sums all of the convolved signals to generate a reconstructed signal of the wideband analog signal.

7. The apparatus of claim 5, wherein the second combiner generates the non-uniform spectral partitioning of the wideband analog signal without knowledge of the signal location within a spectral region and without knowledge of the bandwidth of the wideband analog signal.

8. The apparatus of claim 5, wherein each of the plurality of up-samplers inserts M-1 0s between successive samples, in each sub-band channel to restore each sub-band signal to a Nyquist sampling rate.

9. A method for sampling a wideband analog signal, the method comprising:

receiving the wideband analog signal;

splitting the received wideband analog signal into N parallel channels, where N is an integer;

randomly demodulating each of the signals in N parallel channels with non-identical pseudo-random binary spreading codes to uniquely demodulate each of the signals in each N parallel channels;

sampling each randomly demodulated signal using a sub-Nyquist sampling rate;

combining each sampled signal into a sub-Nyquist digitized random demodulated signal;

compressive sensing the combined sub-Nyquist digitized random demodulated signal to estimate missing samples of a full Nyquist rate uniform sample set $X(n)$;

sequentially delaying $X(n)$ with N identical first delays to generate N delayed signals;

decimating each of the N delayed signals by M, where M is an integer less than or equal to N;

filtering each of the N decimated signals by N corresponding identical filters;

performing a Fast Fourier Transform (FFT) on the N filtered signals;

processing outputs of the FFT;

performing an inverse Fast Fourier Transform (IFFT) on the processed signals;

filtering outputs of the IFFT to generate N filtered signals;

up-sampling each filtered signal;

sequentially delaying each up-sampled signal with N identical second delays; and combining two or more of the delayed up-sampled signals to generate a non-uniform spectral partitioning of the wideband analog signal.

10. The method of claim 9, wherein the combining two or more of the delayed up-sampled signals further comprises combining all of the convolved signals to generate a reconstructed signal of the wideband analog signal.

11. The method of claim 9, wherein the generation of the non-uniform spectral partitioning of the wideband analog signal is performed without knowledge of the signal location within a spectral region and without knowledge of the bandwidth of the wideband analog signal.

12. An apparatus for sampling a wideband analog signal comprising:

a plurality of splitter for splitting the wideband analog signal into N parallel channels, where N is an integer;

a plurality of demodulators for randomly demodulating each of the signals in N parallel channels with non-identical pseudo-random binary spreading codes to uniquely demodulate each of the signals in each N parallel channels;

a plurality of samplers for sampling each randomly demodulated signal using a sub-Nyquist sampling rate;

a first combiner for combining each sampled signal into a sub-Nyquist digitized random demodulated signal;

a compressive sensor for compressive sensing the combined sub-Nyquist digitized random demodulated signal to estimate missing samples of a full Nyquist rate uniform sample set $X(n)$;

a first tab delay line including N identical first delays for sequentially delaying $X(n)$ to generate N delayed signals;

a plurality of decimators for decimating each of the N delayed signals by M, where M is an integer less than or equal to N;
a plurality of analysis filters for filtering each of the N decimated signals;
a Fast Fourier Transform (FFT) module for performing an FFT on the N filtered signals;
a processor for processing outputs of the FFT;
an Inverse Fast Fourier Transform (IFFT) module for performing an IFFT on the processed signals;
a plurality of synthesis filters for filtering outputs of the IFFT to generate N filtered signals;
a plurality of up-samplers for up-sampling each filtered signal;
a second tab delay line including N second delays for sequentially delaying each up-sampled signal; and
a second combiner for combining two or more of the delayed up-sampled signals to generate a non-uniform spectral partitioning of the wideband analog signal.

13. The apparatus of claim 12, wherein the second combiner combines all of the convolved signals to generate a reconstructed signal of the wideband analog signal.

14. The apparatus of claim 12, wherein each of the plurality of demodulators randomly demodulates a respective signal with a different pseudo-random binary spreading codes to uniquely demodulate each of the signals.

15. The apparatus of claim 12, wherein the second combiner generates the non-uniform spectral partitioning of the wideband analog signal without knowledge of the signal location within a spectral region and without knowledge of the bandwidth of the wideband analog signal.

* * * * *